United States Patent
Omori (10) Patent No.: US 8,624,614 B2
(45) Date of Patent: Jan. 7, 2014

(54) BURN-IN METHOD FOR SURFACE EMITTING SEMICONDUCTOR LASER DEVICE

(75) Inventor: Seiya Omori, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 374 days.

(21) Appl. No.: 12/605,414

(22) Filed: Oct. 26, 2009

(65) Prior Publication Data

US 2010/0273278 A1    Oct. 28, 2010

(30) Foreign Application Priority Data

Apr. 22, 2009   (JP) ................................ 2009-103549

(51) Int. Cl.
    *G01R 31/10*   (2006.01)
(52) U.S. Cl.
    USPC .................................................... 324/750.05
(58) Field of Classification Search
    USPC ............................................ 324/750.05–750.1
    See application file for complete search history.

(56) References Cited

U.S. PATENT DOCUMENTS

| | | | | |
|---|---|---|---|---|
| 5,929,651 A | * | 7/1999 | Leas et al. ................. | 324/754.16 |
| 6,137,305 A | * | 10/2000 | Freund et al. ............ | 324/754.03 |
| 6,259,264 B1 | * | 7/2001 | Freund et al. ............ | 324/750.08 |
| 7,190,184 B2 | * | 3/2007 | Haji-Sheikh et al. .... | 324/750.05 |
| 7,268,570 B1 | * | 9/2007 | Audet et al. ............. | 324/750.05 |
| 8,067,949 B2 | * | 11/2011 | Herrick et al. ........... | 324/750.05 |
| 8,178,364 B2 | * | 5/2012 | Hiraiwa et al. ................. | 438/14 |
| 8,294,484 B1 | * | 10/2012 | Thiyagarajan ........... | 324/762.01 |
| 8,384,405 B2 | * | 2/2013 | Shimazawa et al. ...... | 324/754.23 |
| 8,446,161 B2 | * | 5/2013 | Chang ........................ | 324/750.3 |
| 2005/0201763 A1 | | 9/2005 | Kaneko | |
| 2006/0023760 A1 | * | 2/2006 | Kim et al. .................. | 372/38.02 |
| 2010/0127712 A1 | * | 5/2010 | Miya et al. ..................... | 324/537 |
| 2011/0018566 A1 | * | 1/2011 | Crafts et al. ............. | 324/754.07 |

FOREIGN PATENT DOCUMENTS

| | | |
|---|---|---|
| JP | 6-232227 | 8/1994 |
| JP | 08-111443 | 4/1996 |
| JP | 2005-510044 | 4/2005 |
| JP | 2005-259885 | 9/2005 |
| JP | 2008-227463 | 9/2008 |
| WO | 03/017326 | 2/2003 |

OTHER PUBLICATIONS

Japanese Office Action in JP 2009-103549 and English translation.

* cited by examiner

*Primary Examiner* — Joshua Benitez-Rosario
(74) *Attorney, Agent, or Firm* — Fildes & Outland, P.C.

(57) ABSTRACT

A burn-in method includes applying a stress current for applying thermal stress to a surface-emitting semiconductor laser, measuring an operation characteristic of the surface-emitting semiconductor laser to which the stress current is applied, and making a pass/fail decision on the surface-emitting semiconductor laser on the basis of the operation characteristic measured.

8 Claims, 10 Drawing Sheets

BURN-IN METHOD FOR SURFACE EMITTING SEMICONDUCTOR LASER DEVICE

CROSS-REFERENCE TO RELATED APPLICATION

This application is based on and claims priority under 35 USC 119 from Japanese Patent Application No. 2009-103549 filed on Apr. 22, 2009.

BACKGROUND (i) Technical Field

The present invention relates to a burn-in method for a surface emitting semiconductor laser device and a computer readable medium storing a program causing a computer to execute a burn-in process for a surface emitting semiconductor laser device.

(ii) Related Art

A burn-in process is a screening test for detecting particular semiconductor devices that would fail prior to shipping. The general burn-in process holds the semiconductor devices or wafers in a bathtub at a high temperature during a predetermined period of time and measures electrical characteristics in a state where thermal stress is being applied to the devices or wafers. For light emitting devices, the burn-in process is followed by a further process for measuring the optical performance. The further process uses a system for the optical measurement separate from the bathtub.

SUMMARY

According to an aspect of the present invention, there is provided a burn-in method including: applying a stress current for applying thermal stress to a surface-emitting semiconductor laser; measuring an operation characteristic of the surface-emitting semiconductor laser to which the stress current is applied; and making a pass/fail decision on the surface-emitting semiconductor laser on the basis of the operation characteristic measured.

BRIEF DESCRIPTION OF THE DRAWINGS

Exemplary embodiments of the present invention will be described in detail based on the following figures, wherein.

DETAILED DESCRIPTION

A description will now be given of exemplary embodiments of the present invention. Some exemplary embodiments apply a burn-in process to a vertical cavity surface emitting laser (VCSEL) of selective oxidation type and screens a faulty VCSEL in a short period of time at low cost. The scale of the figures is emphasized for the purpose of better understanding of the exemplary embodiments and is not identical to the actual device scale.

Figure 1A:
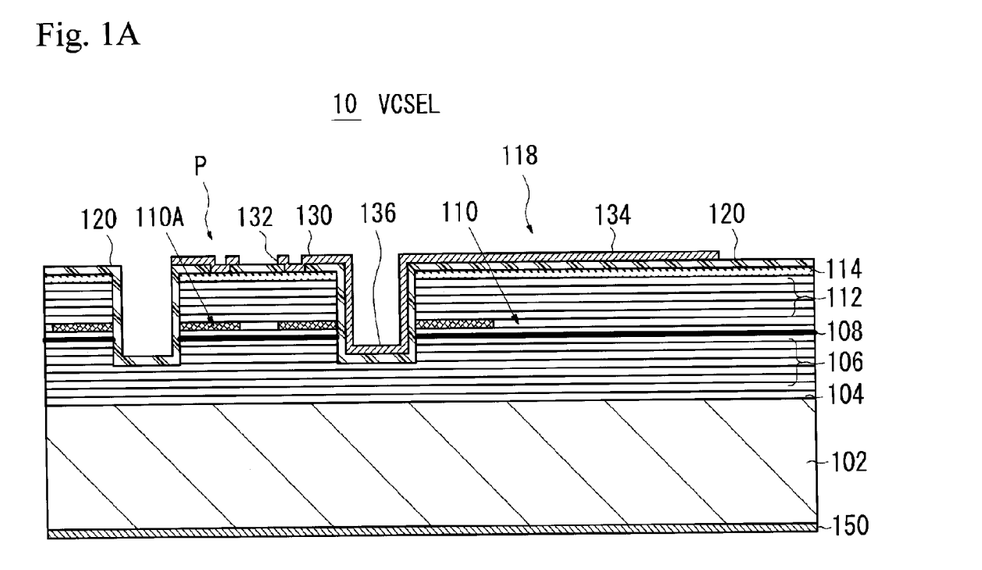
FIG. 1A is a cross-sectional view of a surface emitting semiconductor laser (VCSEL) of selective oxidation type.

FIG. 1A is a cross-sectional view of an exemplary VCSEL of selective oxidation type. A VCSEL 10 has an n-type GaAs substrate on which there are stacked an n-type GaAs buffer layer 104, an n-type lower Distributed Bragg Reflector (DBR) 106, an active region 108, a current confining layer 110, and a p-type upper DBR 112 in this order. The n-type lower DBR layer 106 is composed of AlGaAs layers that have different Al compositions and are alternately stacked. The current confining layer 110 is formed of p-type AlAs. The p-type upper DBR 112 is composed of AlGaAs layers that have different Al compositions and are alternately stacked. The uppermost layer of the upper DBR 112 may be a p-type GaAs contact layer 114, and the lowermost layer thereof may be the current confining layer 110. An n-side electrode 150 is formed on the backside of a substrate 102.

A cylindrical post (column structure) P that functions as a light emitting part of laser is defined by etching the stacked layer structure from the upper DBR 112 to a part of the lower DBR 106. An electrode pad 134 is formed in a pad formation area 118, which is separate from the post P across a groove. The current confining layer 110 includes an oxidized region 110A and a circular conductive region. The oxidized region 110A is formed by selectively oxidizing an outer circumferential portion of the post P from the side surface of the post P. The conductive region is surrounded by the oxidized region 110A. The current confining layer thus formed confines current and light within the conductive region.

An interlayer insulation film 120, which may be made of, for example, SiNx, is formed on the substrate including a part of the top of the post P. A ring-shaped contact hole is formed in the interlayer insulation film 120 at the top of the post P. A p-side upper electrode 130 is electrically connected to the contact layer 114 via the contact hole. The p-side upper electrode 130 may be made of, for example, gold or titanium/gold, and has an aperture 132 located at the center and shaped into a circle. The aperture 132 defines an emission range of the laser beam. In the exemplary structure illustrated in FIG. 1, the aperture 132 is covered with the interlayer insulation film 120 to thus protect the contact layer 114 so as not to be exposed to the outside. The aperture 132 is not necessarily covered with the interlayer insulation film 120 but may be exposed. The electrode pad 134 shaped into a circle is formed on the interlayer insulation film 120 in the pad formation area 118, and is connected to the p-side upper electrode 130 via a lead interconnection 136.

Figure 1B:
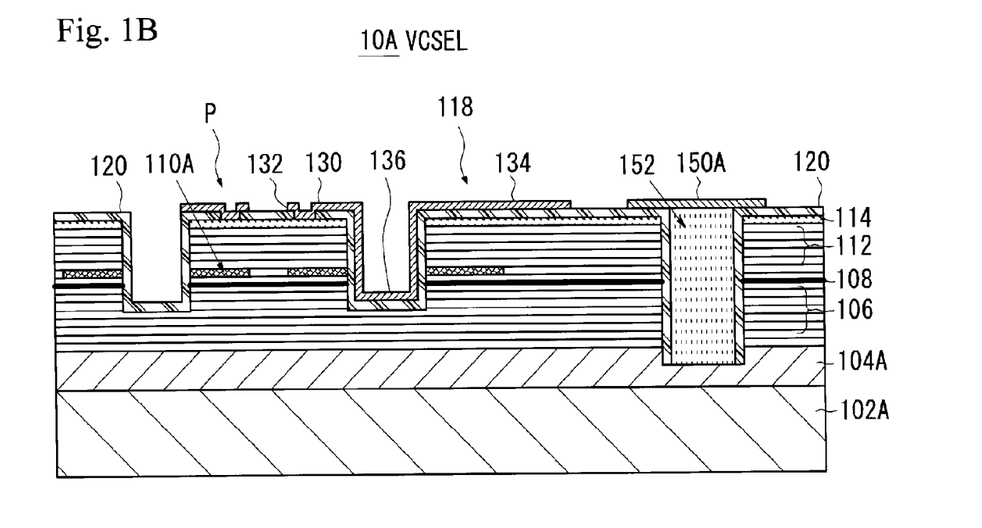
FIG. 1B is a cross-sectional view of another VCSEL of selective oxidation type.

A VCSEL 10A illustrated in FIG. 1B does not have the n-side electrode 150 on the backside of the substrate but has an n-side electrode 150A formed on the main surface of the substrate. This structure enables surface mounting or flipchip mounting. A substrate 102A of the VCSEL 10A may be an intrinsic GaAs semiconductor substrate, and an n-type GaAs layer 104A is formed on the substrate 102A. A trench is formed from the surface of the substrate to the GaAs layer 104A and is full of a conductive material 152. The n-side substrate 150A is formed on the conductive material 152 and is electrically connected to the GaAs layer 104A. The remaining structures of the VCSEL 10A are the same as those of the VCSEL 10.

The VCSEL does not have catastrophic optical degradation (COD) which the edge emitting semiconductor laser has. Thus, most of optical degradation due to the current upper limit is thermal breakdown. Heat generation resulting from current injection concentrates on the post P of the VCSEL. Thus, the conditions for applying stress to the VCSEL depend on the VCSEL temperature and the heat resistance of each substance that forms the VCSEL. An exemplary substance that is often used for VCSEL and has a low melting point is gold for the p-side electrode (having a melting point of about 1000° C., and the alloy temperature of Au and AlGaAs or AlGa has a lower melting point than the Au alone, which is as low as about 600° C.

The temperature rise of the light emitting part due to the upper limit of the current injection range in the practical use of VCSEL is 60° C. at maximum. Thus, there is a margin of 540° C. or more in order to thermally break down the normal device. Thus, breakdown caused by injection of high current is effective as a method for burn-in screening thermally weak devices. Particularly, a lattice defect occurs in VCSEL of selectively oxidation type in which the AlAs layer and the AlGaAs layer are selectively oxidized. This is because a lattice mismatch between the AlGaAs layers located on and below the amorphous oxidized layer (current confining layer) formed in the post P. Thus, the burn-in screening may have another requirement in which the injected current corresponds to a temperature higher than the temperature at which AlAs is selectively oxidized. The oxidation temperature of the current confining layer is approximately 340° C. Current easily flows in fine faulty portions in the active layer and the temperature rises quickly due to the current injection. Thus, the optical output is degraded shortly due to current injection corresponding to high temperature. Further, a fault may occur in the Au upper electrode or the AlGaAs lower layer in VCSEL. Thus, by raising the light emitting temperature up to 600° C. by current injection, VCSEL having an ohmic failure between the Au electrode and AlGaAs may be screened.

Figure 2:
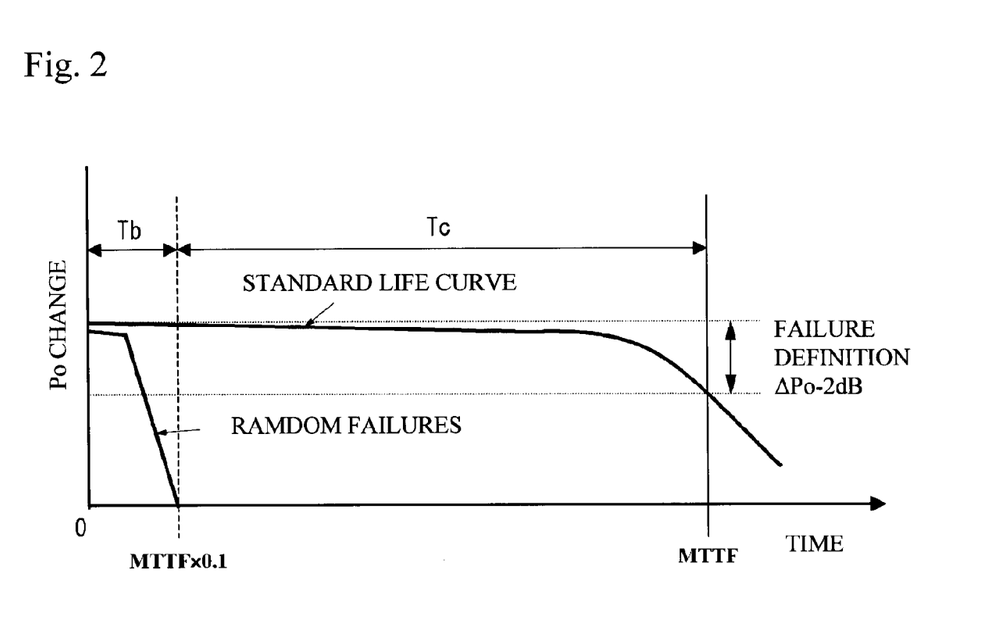
FIG. 2 is a graph of illustrating a relation between change of the optical power of VCSEL and time.

Next, the burn-in process for VCSEL is described. FIG. 2 is a graph of illustrating a relation between change of the optical power of VCSEL and time. In FIG. 2, the vertical axis is the amount of light, and the horizontal axis is the time. It is assumed that Po is the amount of light obtained when the VCSEL operates normally in room temperature (25° C.). When the amount Po of light reduces by 2 dB, the VCSEL is determined to be failure. The usable period Tc of VCSEL is up to the means time to failure (MTTF) when the failure occurs. Tb is the burn-in period, which may be defined as MTTF×0.1. By applying stress to VCSEL for the burn-in period Tb, random failures that occur at the initial stage of VCSEL in operation can be detected. The initial failures of VCSEL may be sudden death in which the amount Po of light is zero. A failure mode that causes sudden death may be crystal defect caused in the active layer during the epitaxial growth, stress change due to crack, peeling or flaw in the protection film that covers the post P, and change of the nature of the surface film caused by alloying due to local Joule heat between the p-side upper electrode and the contact layer.

The burn-in process of the present exemplary embodiment applies high stress current to the VCSEL placed in the room-temperature environment and thus applies an abrupt thermal load or stress to the VCSEL. The stress current is greater than the current that causes thermal rollover of VCSEL and is smaller than the failure current at which the VCSEL fails. The burn-in period is set equal to or shorter than 2 seconds by applying the stress current to VCSEL.

Figure 3:
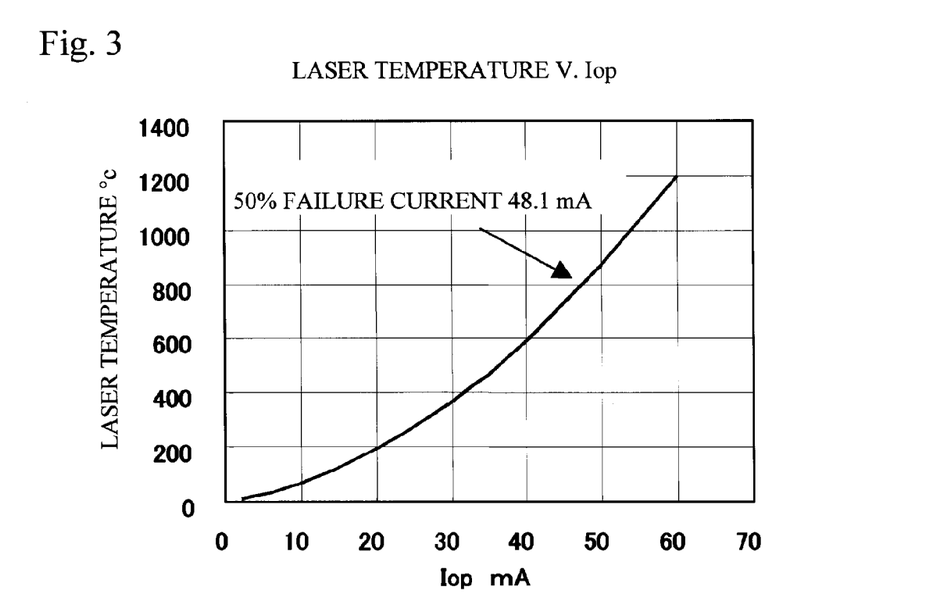
FIG. 3 is a graph of an estimated relation between the laser temperature (estimated) and drive current injected to the VCSEL.

FIG. 3 is a graph of an estimated relation between the laser temperature (the inner temperature of the post P) and drive current Iop injected to the VCSEL. The laser temperature rises as the drive current Iop increases. The drive current obtained when the amount Po of light of the VCSEL reduces by 2 dB, that is, the failure current is 48.1 mA. At this time, the laser temperature is approximately 810° C. It is estimated that the p-side Au electrode on the top of the post P starts melting. Thus, the stress current in the burn-in process may be set to a current value with which the laser temperature is lower than 810° C.

Figure 4:
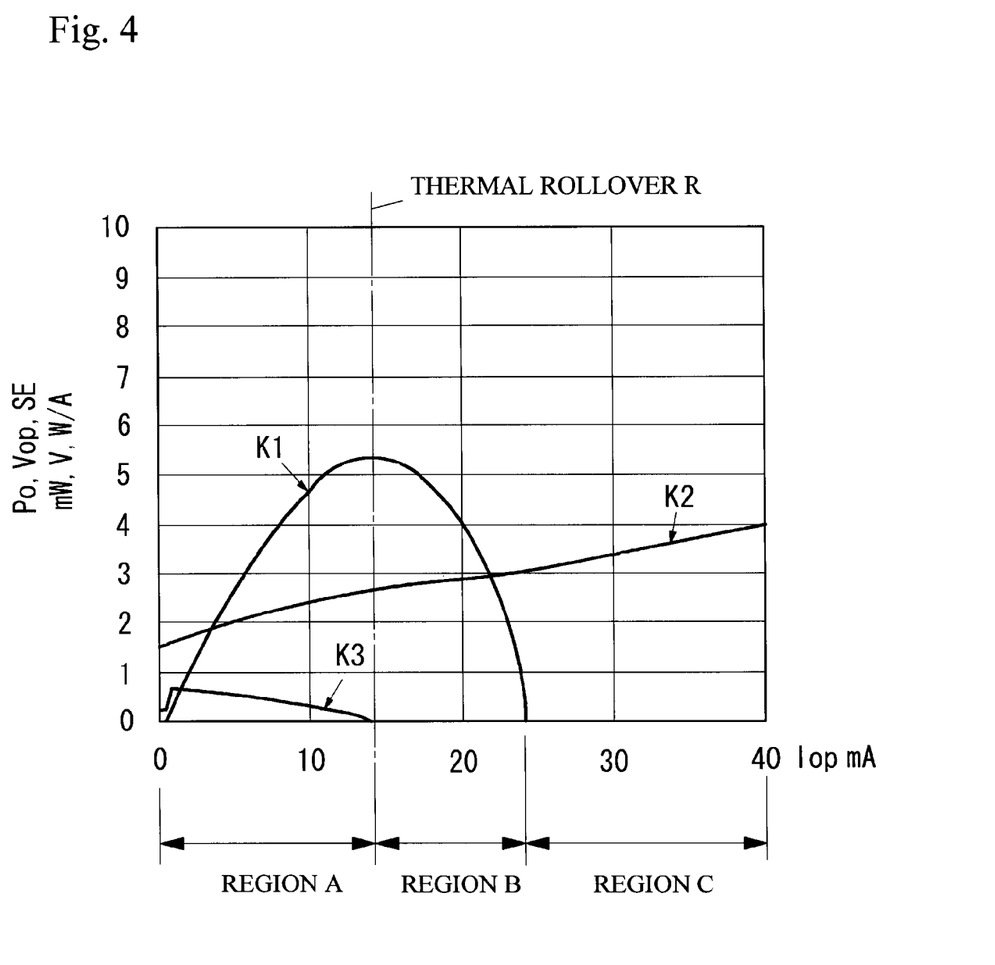
FIG. 4 is a graph of exemplary setting ranges of stress current in a burn-in process in accordance with an exemplary embodiment.

FIG. 4 is a graph of exemplary setting ranges of the stress current in the burn-in process of the present exemplary embodiment. The horizontal axis of the graph is the drive current Iop supplied to the VCSEL, and the vertical axis is the scales of the amount of light and voltage. A curve K1 is the amount of laser light emitted by the VCSEL, and a curve K2 is the operating voltage of the VCSEL. A curve K3 is the slope effect. The drive current Iop supplied to the VCSEL is segmented into three ranges A, B and C associated with changes in the amount of light of the VCSEL.

The range A is between a current value with which the VCSEL starts emitting the laser oscillation and a current value located at a turning point at which the amount Po of light of the VCSEL changes from increasing to decreasing. The latter current value is located at the turning point of the thermal rollover R. In the range A, the dominant factor is the electro-optic conversion in which the current injected to the VCSEL is converted to light. The transverse diffusion current due to increase in current degrades the electro-optic conversion efficiency and generates heat. The range A may be used in the normal operation mode, normal inspection and burn-in process.

The range B is between the current value at the turning point at which the amount Io of light of the VCSEL changes from increasing to decreasing (the turning point of the thermal rollover R) and a current value with which the amount Po of light is zero. In the range B, the dominant factor is the electro-thermal conversion. The electro-optic conversion in the active layer is saturated and extra injection current is converted to heat. The range B may be used for stress current in the burn-in process and a failure detection mode of the present exemplary embodiment.

The range C is between the upper limit of the current value of the region B and the failure current value. The dominant factor is the electro-thermal conversion, and the laser oscillation does not take place. The region C may be used for stress current in the burn-in process that is carried out for an extremely short period of time at room temperature.

The burn-in process of the present exemplary embodiment is based on the experimental results conducted by the inventors in which the applied temperature range associated with the change of the optical output is expanded by applying high stress current to the VCSEL at room temperature of 25° C. For example, the conventional burn-in process may be typically carried out in such a manner that the burn-in time Tb is set equal to tens to hundreds of hours and the laser temperature is equal to or lower than around 200° C. In contrast, according to the present exemplary embodiment, the laser temperature is around 600° C. and the burn-in period Tb is set equal to 2 seconds or less.

Figure 5:
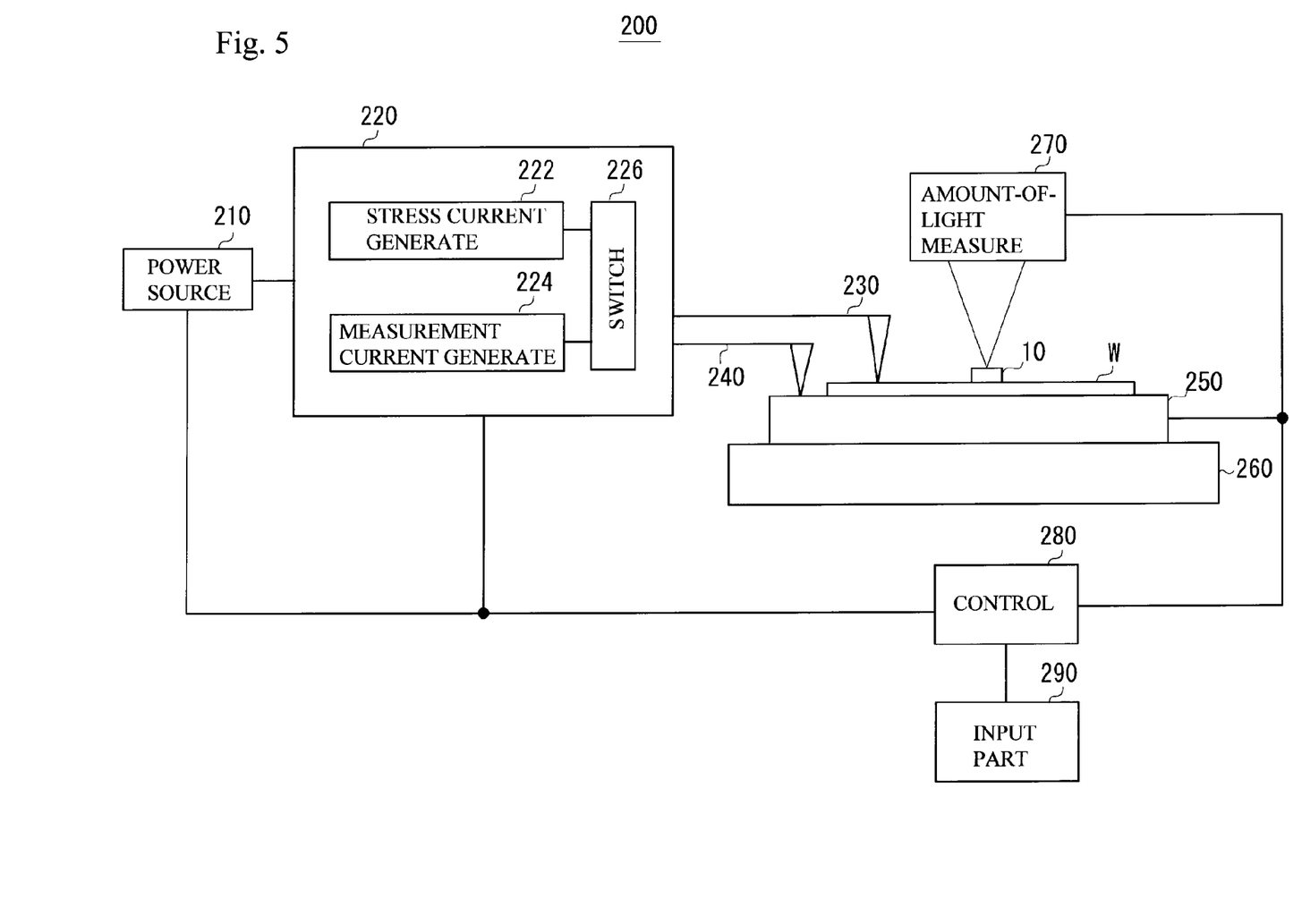
FIG. 5 is a block diagram of a burn-in system in accordance with an exemplary embodiment.

Another exemplary embodiment is described below. FIG. 5 is a block diagram of a system for carrying out the burn-in process in accordance with an exemplary embodiment. A burn-in system 200 is composed of a current source 210, a current drive part 220, a p-side probe pin 230, an n-side probe pin 240, a moving type suction stage 250, a anti-vibration stage 260, a moving type amount-of-light measurement unit 270, a control part 280 and an input part 290. The current drive part 220 generates the stress current and measurement current from the current supplied from the current source 210. The probe pins 230 and 240 are electrically connected to the current drive part 220. A wafer W on which VCSELs are integrally formed is placed on the suction stage 250, which is placed on the anti-vibration stage 260. The suction stage 250 functions as a support member. The amount-of-light measurement unit 270 measures the amount of light emitted by the VCSEL. The control part 280 controls the above-described parts. The input part 290 is used to apply instruction from the user to the control part 280.

The current drive part 220 includes a stress current generating part 222, a measurement current generating part 224, and a switch part 226. The stress current generating part 222 generates the stress current applied to the VCSEL. The measurement current generating part 224 generates the measurement current applied to the VCSEL. The switch part 226 applies the stress current or the measurement current to the p-side probe pin 230 and the n-side probe pin 240. The switch part 226 switches the stress current and the measurement current in accordance with a switch instruction signal from the control part 280.

The wafer W on which the VCSEL are formed is sucked to and fixed to the moving type suction stage 250. The suction stage 250 is moved on the anti-vibration stage 260 in X and Y directions in accordance with a corresponding control signal from the control part 280 so that the p-side and n-side electrodes of the VCSEL to be measured are positioned to the p-side and n-side probe pins 230 and 240, respectively, and are electrically connected thereto. The suction stage 250 has an electronic temperature control function, and is capable of adjusting the temperature of the suction stage 250 in accordance with a corresponding control signal from the control part 280.

The amount-of-light measurement unit 270 measures the amount of light emitted from the VCSEL 10 to be measured when the measurement current is applied to the VCSEL 10, and applies the measurement results to the control part 280. Although the amount-of-light measurement unit 270 may be of fixed type, it is preferably configured to move on the X-Y plane in accordance with a corresponding control signal from the control part 280.

Figure 6:
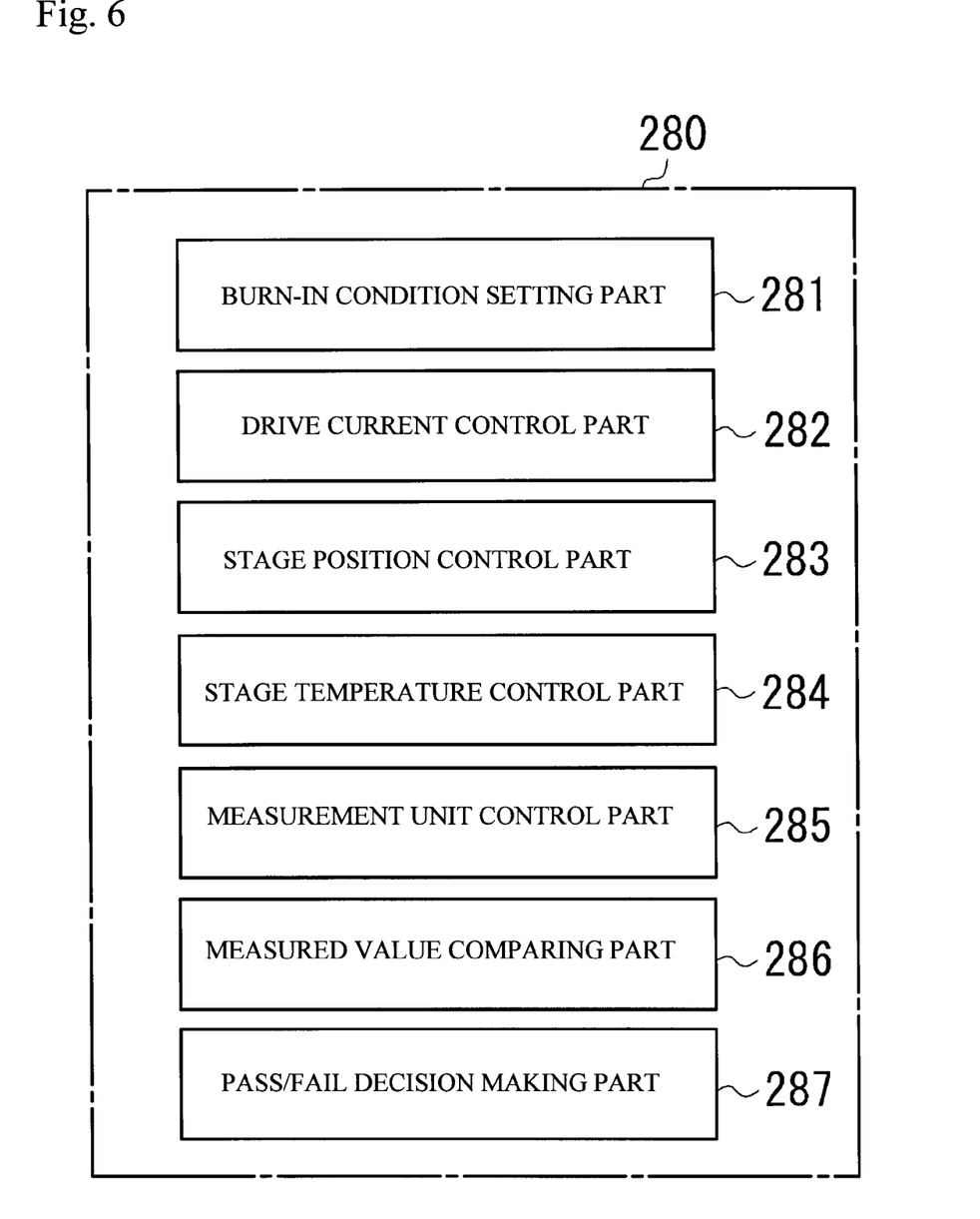
FIG. 6 is a block diagram of functional blocks of a control part illustrated in FIG. 5.

The control part 280 is preferably composed of a memory that stores a program, and an operation unit that executes the program read from the memory for controlling the parts of the burn-in system 200. FIG. 6 is a functional block diagram of the control part 280. The control part 280 includes a burn-in condition setting part 281, a drive current control part 282, a stage position control part 283, a stage temperature control part 284, a measurement unit control part 285, a measured value comparing part 286, and a pass/fail decision making part 287. The burn-in condition setting part 281 sets the burn-in conditions in the control part 280. The drive current control part 282 controls the current drive part 220 in accordance with the process sequence of burn-in. The stage position control part 283 controls the position of the suction stage 250 so that the VCSEL 10 to be measured is brought into contact with the p-side and n-side probe pins 230 and 240. The stage temperature control part 284 adjusts the temperature of the suction stage 250. The measurement unit control part 285 controls the measurement unit for measuring the amount of light from the VCSEL 10. The measured value comparing part 286 compares the amounts of light measured before and after the stress current is applied with each other. The pass/fail decision making part 287 makes a decision on the VCSEL 10 on the basis of the comparison results obtained by the measured value comparing part 286.

Figure 7:
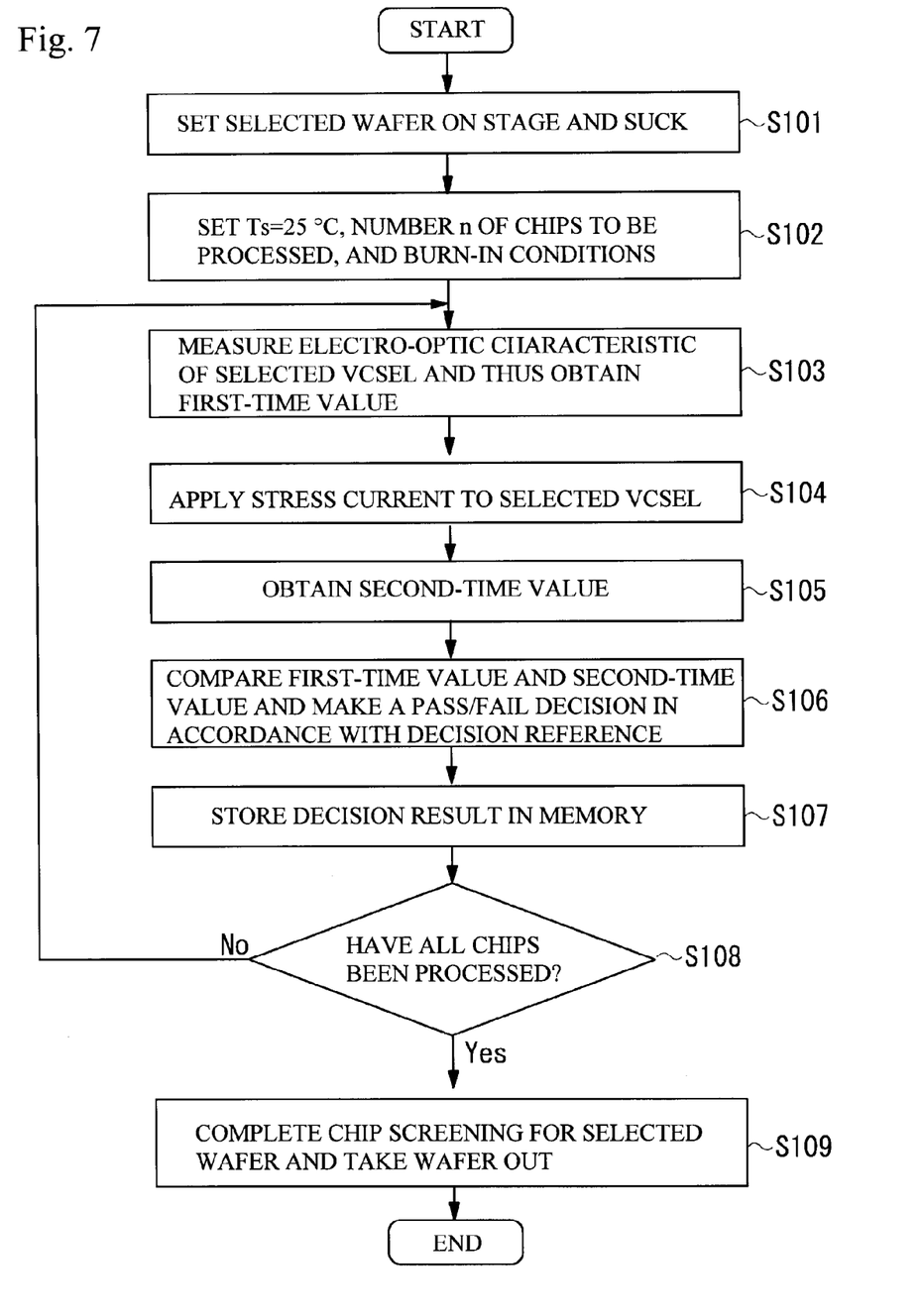
FIG. 7 is a flowchart of a wafer-level burn-in process in accordance with an exemplary embodiment.

A description will now be given of a wafer-level burn-in method in accordance with an exemplary embodiment with reference to a flowchart of FIG. 7. First, the wafer W is placed on the suction stage 250 and is sucked thereto (step S101). Next, the burn-in condition setting part 281 reads the burn-in conditions, which may be stored in the memory beforehand or may be supplied by the input part 290, and sets the burn-in conditions in the control part 280. For example, the input part 290 supplies the control part 280 with information about the number n of chips that are integrally formed on the wafer W and should be subjected to the burn-in process, the screening condition, and the temperature Ta of the suction stage 250 to be set (which may be equal to 25° C.) (step S102). After the burn-in conditions are thus set in the burn-in condition setting part 281, as necessary, the stage temperature control part 284 sets the temperature of the suction stage 250 to the room temperature of 25° C. on the basis of the burn-in conditions.

Then, the electro-optic characteristic of the specific or selected VCSEL 10 on the wafer W is measured (step S103). In this measurement, the stage position control part 283 moves the suction stage 250 to electrically contacts the p-side and n-side probe pins 230 and 240 to the p-side and n-side electrodes of the VCSEL 10. The switch part 226 of the current drive part 220 supplies the measurement current generated by the measurement current generating part 224 to the VCSEL 10. The VCSEL 10 driven by the measurement current emits the laser beam via the emission window of the post P. The amount-of-light measurement unit 270 is positioned to the target VCSEL 10, and measures the amount of light emitted by the VCSEL 10. The amount of light thus measured is stored in the measured value comparing part 286 as the initial value obtained by the first measurement (step S103).

In accordance with the burn-in conditions thus set, the stress current is applied to the selected VCSEL 10 (step S104). More specifically, the switch part 226 of the current drive part 220 supplies the stress current generated by the stress current generating part 222 to the VCSEL 10. As has been described, the stress current falls in the region B or C higher than the thermal rollover. When the stress current that approximately corresponds to an inner temperature of the post P of 600° C. is applied to the VCSEL 10, the stress current is applied for about 2 seconds.

The second-time measurement for the electro-optic characteristic of the selected VCSEL 10 is measured (step S105). The second-time measurement is carried out in the same manner as the first-time measurement. The measured value obtained by the second-time measurement is supplied to the measured value comparing part 286, which compares the measured value of the first-time measurement with the measured value of the second-time measurement. The pass/fail decision making part 287 makes a pass/fail decision on the comparison results in accordance with a predetermined decision reference (step S106). The decision result by the pass/fail decision making part 287 is stored in the memory in associated with the selected VCSEL 10 (step S107).

When the burn-in process for the selected VCSEL 10 is complete, the control part 280 determines whether all of the chips have been processed by referring to the number n of chips (step S108), and proceeds to step S103 to process the next VCSEL 10 if the answer is NO. This process is repeatedly carried out until all of the VCSELs 10 on the wafer W are completed. When all of the VCSELs 10 are completed, the screening process for the wafer W is completed, and the wafer W is taken out from the suction stage 250 (step S109). Then, VCSELs that are determined to be abnormal or faulty ones on the wafer W are marked.

According to the present exemplary embodiment, the wafer-level burn-in process is carried out in the room-temperature environment. It is thus possible to reduce the problem arising from the difference in thermal expansion between the heat generation of the wafer and the probe pin array and to suppress heat generation by stress. Further, there is no need for a facility such as a large-scale chamber or furnace for keeping the wafer at high temperatures and for physically and thermally separating the function of detecting the amount of light from the facility. Furthermore, there is no need for particular dedicated probe pin arrays and probe cassette. This makes it possible to handle various mask pin patterns and increase the degree of freedom of mask design and facilitate design change.

Figure 8:
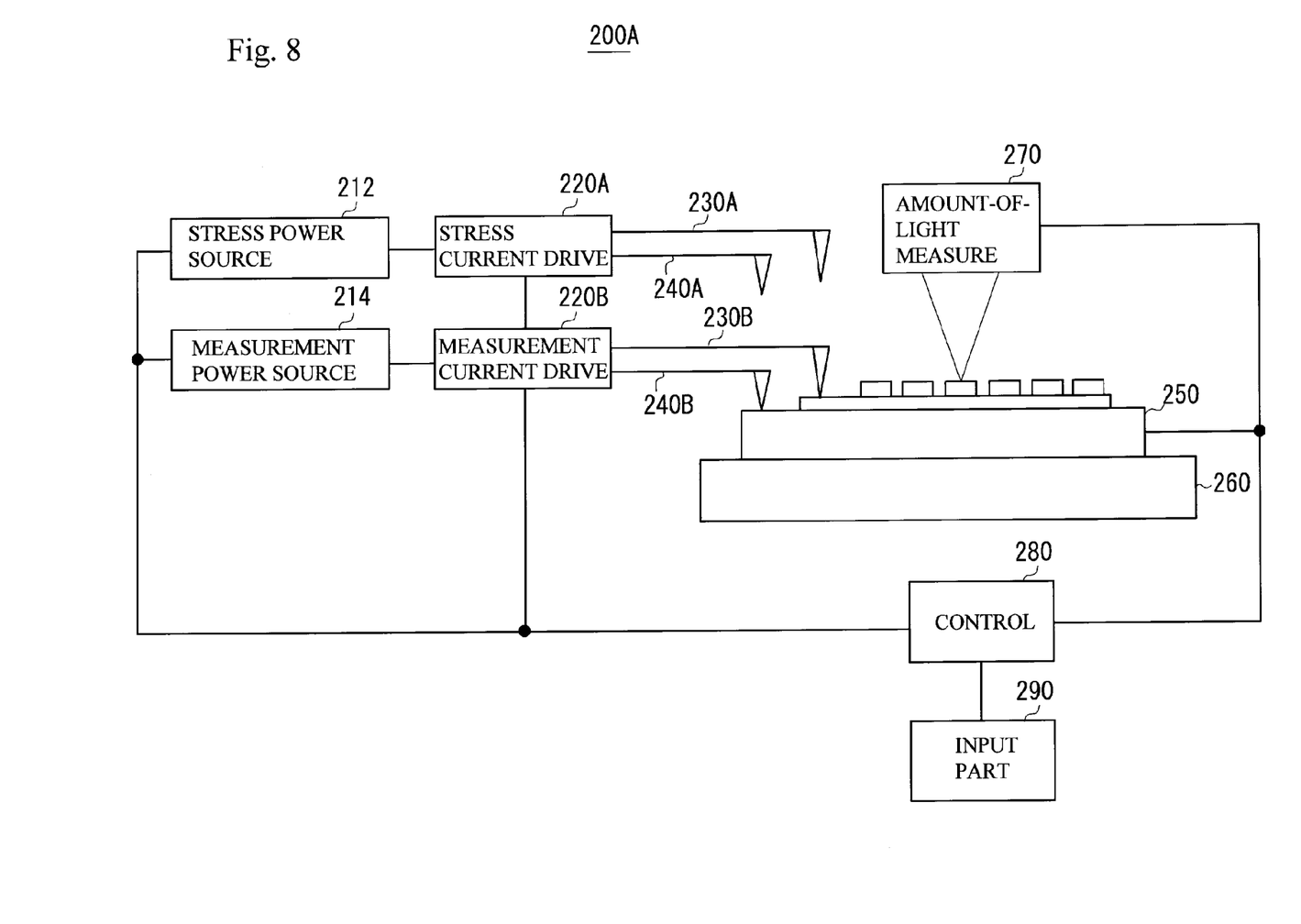
FIG. 8 is a block diagram of a burn-in system in accordance with another exemplary embodiment.

A second exemplary embodiment will now be described. FIG. 8 is a block diagram of a burn-in system in accordance with a second exemplary embodiment. A burn-in system 200A of the second exemplary embodiment includes a stress power source 212, a measurement power source 214, a stress current drive part 220A, and a measurement current drive part 220B. The stress current drive part 220A supplies a stress current supplied from the stress power source 212 to a first set of p-side and n-side probe pins 230A and 240A. The measurement current drive part 220B supplies a measurement current supplied from the measurement power source 214 to a second set of p-side and n-side probe pins 230B and 240B. According to the second exemplary embodiment, the single system has the stress power source 212 and the measurement power source 214, and performs a cascade process in which the application of stress and the optical measurement are alternately carried out by using the two sets of probe pins 230A and 240A, and 230B and 240B.

Figure 9:
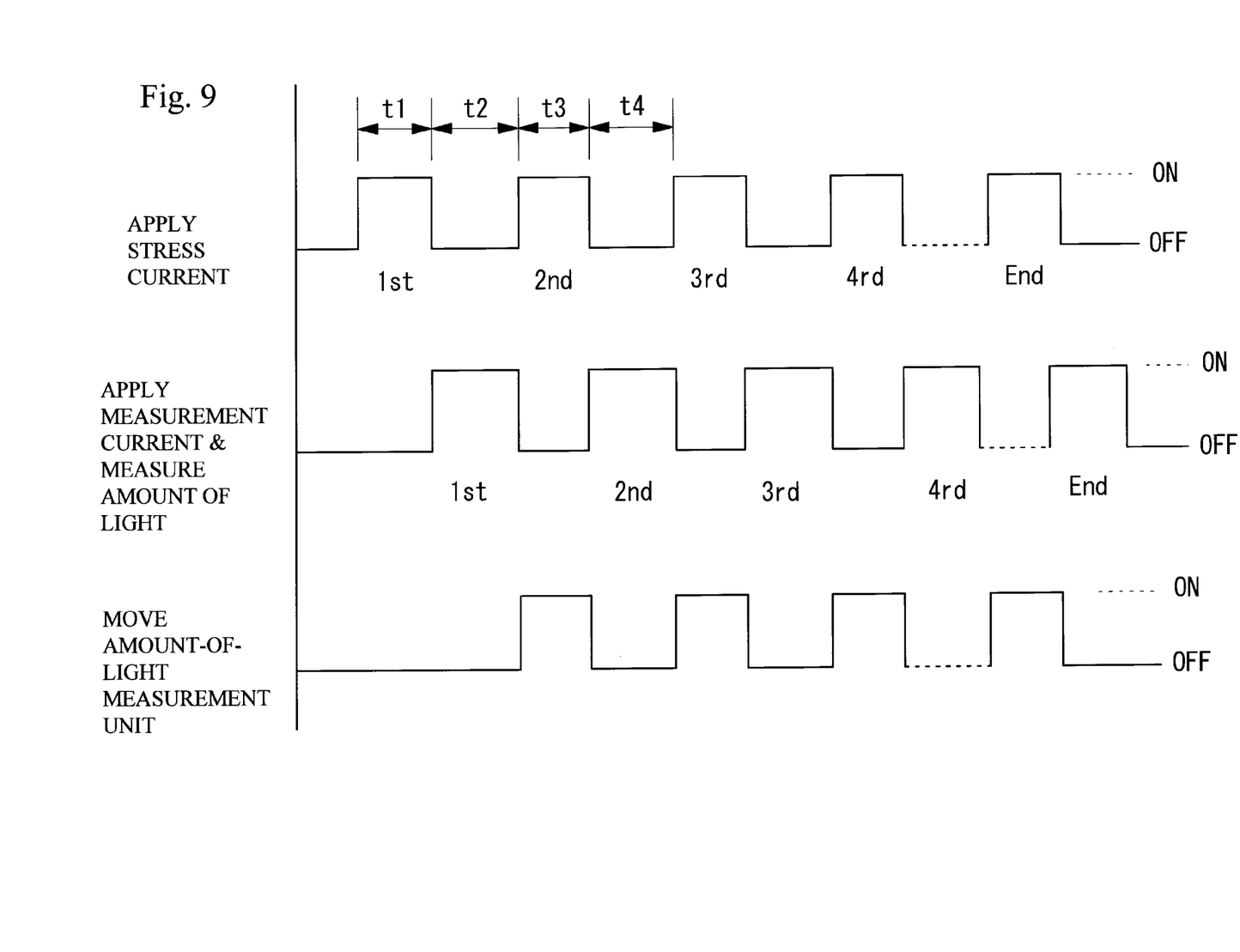
FIG. 9 is a timing chart of an operation of the burn-in system illustrated in FIG. 8.

FIG. 9 is a timing chart that describes a program process sequence of the control part 280 in accordance with the second exemplary embodiment. More particularly, FIG. 9 illustrates timings of application of the stress current, timings of measurement for the amount of light by applying the measurement current, and timings of movement of the amount-of-light measurement unit.

During a period t1 of time, the first VCSEL on the wafer selected by the stage position control part 283 is positioned to the first set of p-side and n-side probe pins 230A and 230B. Then, the stress current is applied to the first VCSEL by the stress current drive part 220A. Preferably, the stress current falls in the region C (see FIG. 4), and the VCSEL does not oscillate.

During a period t2 of time, the first VCSEL is positioned to the second set of p-side and n-side probe pins 230B and 240B by the stage position control part 283. Then, the measurement current is applied to the first VCSEL by the measurement current drive part 220B. Thus, the first VCSEL oscillates. At this time, the amount-of-light measurement unit 270 is positioned to the first VCSEL, and measures the amount of laser light emitted by the first VCSEL.

During a period t3 of time, the second VCSEL on the wafer is selected and is positioned to the first set of p-side and n-side probe pins 230A and 240A. Then, the stress current is applied to the second VCSEL by the current drive part 220A. During this operation, the amount-of-light measurement unit 270 is moved to a position where the mount of light of the second VCSEL can be measured during a period t4 of time. During the period t4, the second VCSEL is positioned to the second set of p-side and n-side probe pins 230B and 240B. Then, the measurement current is applied to the second VCSEL. The amount of laser light emitted by the second VCSEL is measured by the amount-of-light measurement unit 270. By alternately carrying out the application of the stress current and the electro-optic measurement, the process time it takes to perform the wafer-level burn-in process is reduced.

In the above-described exemplary embodiment, the VCSEL is positioned to the p-side and n-side probe pins by moving the stage. Alternatively, the p-side and n-side probe pins may be moved to the VCSEL. It is possible to employ an arbitrary number of sets of probe pins, each of which is composed of a probe pin for supplying the stress current and another probe pin for supplying the measurement current. That is, the stress current drive part 220A has multiple sets of p-side and n-side probe pins, and simultaneously supplies multiple VCSELs with the stress currents. The measurement current drive part 220B has multiple sets of p-side and n-side probe pins, and simultaneously supplies multiple VCSELs with the measurement currents. The amount-of-light measurement unit measures the amounts of lights concurrently emitted by the multiple VCSELs.

The above-described exemplary embodiment is configured to successively perform the application of the stress current and the electro-optic measurement. This exemplary embodiment may be varied so as to simultaneously perform the two operations in which the stress current is applied to the first VCSEL while the amount of light emitted by the second VCSEL that has been supplied with the stress current is simultaneously measured. The precision of the optical measurement may be degraded due to optical crosstalk from the adjacent VCSEL. However, the present exemplary embodiment does not have such a problem. By supplying the VCSEL with the stress current that is not enough to generate laser oscillation, the electro-optic measurement of the adjacent VCSEL is not affected by the optical crosstalk.

The program that executes the process sequence employed in the second exemplary embodiment makes it possible to successively perform the burn-in process for the multiple VCSELs on the wafer. According to the second exemplary embodiment, the single system enables both the electro-optic measurement and the burn-in. Thus, the operations of the VCSELs before and after the burn-in may be totally evaluated by combining the present system with other measurement units such as a wavelength measurement unit, a fine current measurement unit, a divergence angle measurement unit, and an RF measurement unit.

A third exemplary embodiment is now described. The first and second exemplary embodiments have the wafer-level burn-in process, while the third exemplary embodiment has a burn-in process for a module (surface emitting semiconductor laser device) in which a VCSEL obtained by dividing the wafer into chips is mounted.

Figure 10A:
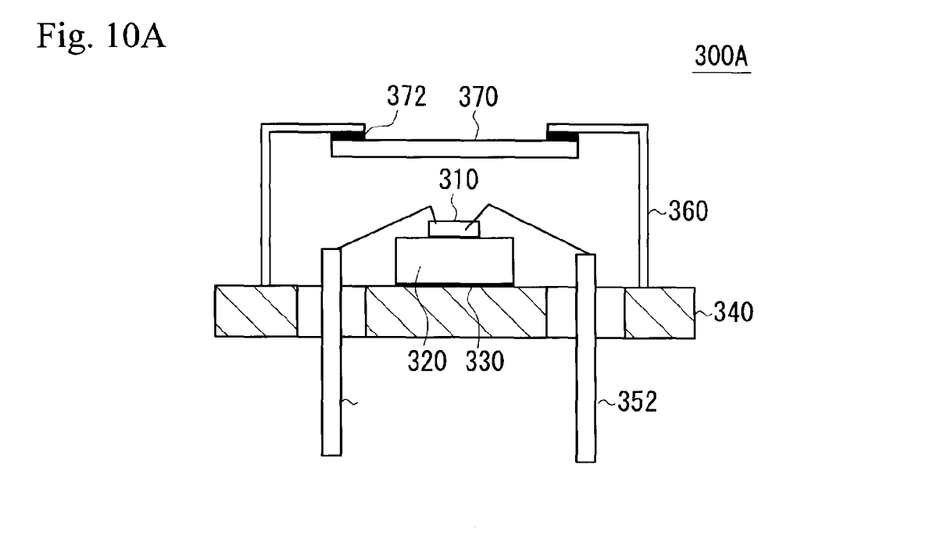
FIGS. 10A through 10C are cross-sectional views of modules in which a surface emitting semiconductor laser is installed.

FIG. 10A illustrates a module 300A. A VCSEL chip 310 is fixed on a sub mount 320, which is fixed to a metal stem 340 by a die bond agent 330. Electrically conductive leads 350 and 352 are inserted into through holes (not illustrated) formed in the metal stem 340. The lead 350 is electrically connected to the n-side electrode of the VCSEL by a bonding wire. The other lead 352 is electrically connected to the p-side electrode by a bonding wire.

A hollow cap 360 shaped into a rectangle is fixed to the stem 340 including the chip 310. A plate glass 370 is fixed to the inner wall of the cap by an adhesive 372 so as to cover a window formed at the center of the cap 360. The center of the plate glass is substantially aligned with the optical axis of the chip 310. The distance between the chip 310 and the plate glass 370 is adjusted so that the diameter of the exposed portion of the plate glass 370 is equal to or greater than the divergence angle θ of the laser beam from the chip 310. The space in the cap 360 is full of an incombustible gas such as air or nitrogen. The module 300A may include a light receiving element for monitoring the light emitting condition of the VCSEL or a temperature sensor.

Figure 10B:
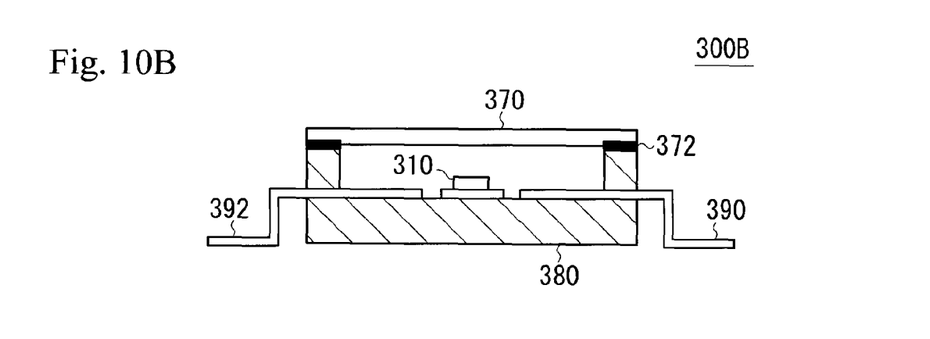

FIG. 10B illustrates a module of lead frame type. A module 300B has a mold resin 380 having an opening, and the plate glass 370 fixed to the mold resin 380 by the adhesive 372 so as to cover the opening. The VCSEL chip 310 is fixed in the module, and lead frames 390 and 392 protrude from opposite sides of the mold resin 380. The lead frames 390 and 392 are electrically connected to the p-side and n-side electrodes of the VCSEL chip 310. The inner space defined by the plate glass 370 and the mold resin 380 is filled with an incombustible gas such as air or nitrogen.

Figure 10C:
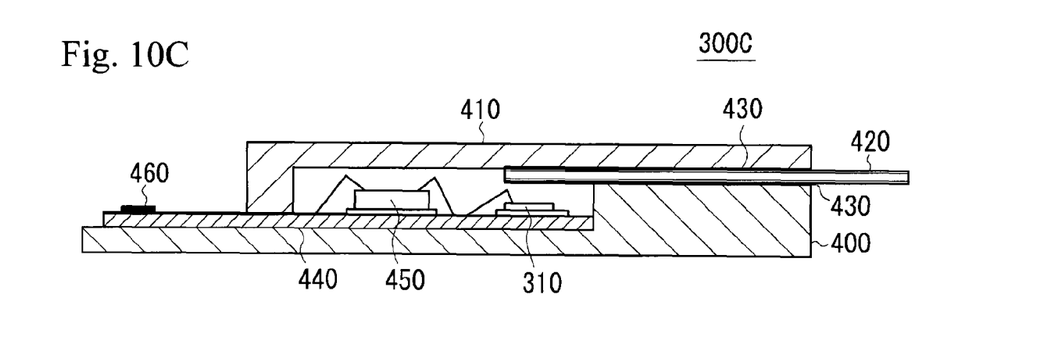

FIG. 10C illustrates a module 300C, which is composed of a metal frame 400, a cap 410 and an optical waveguide 420. The cap 410 is attached to the metal frame 400. The optical waveguide 420 is fixed between the metal frame 400 and the cap 410 by an adhesive 430. A flexile board 440 is attached on the metal frame 400. The VCSEL chip 310 is fixed on the flexible board 440 by a die bond agent. The electrodes of the VCSEL chip 310 and those of a chip 450 are connected to an interconnection pattern formed on the flexible board 440 by bonding wires. An end of the flexible board 440 protrudes from the cap 410 and is connected to an external lead electrode 460.

Figure 11:
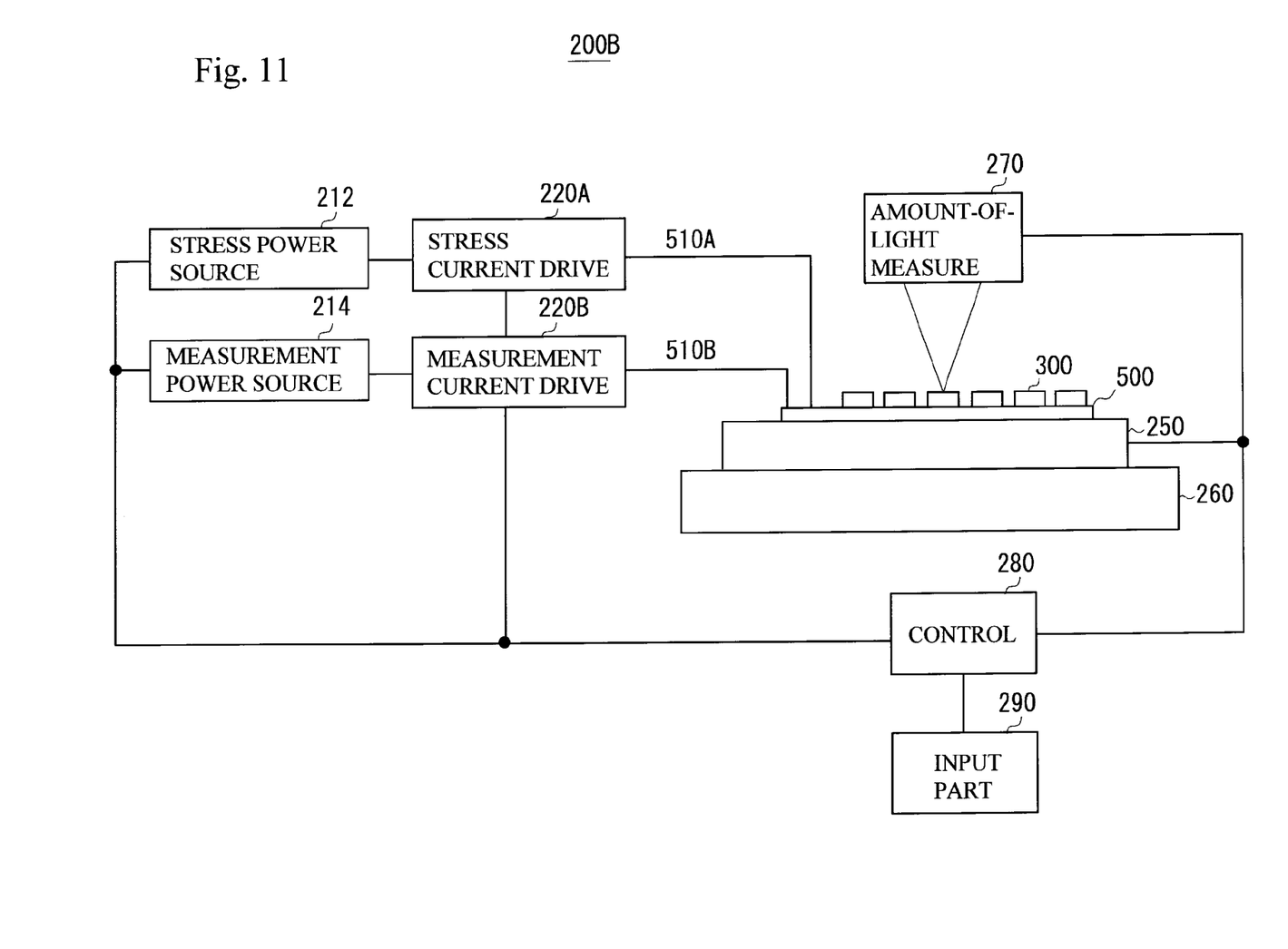
FIG. 11 is a block diagram of a burn-in system in accordance with a further exemplary embodiment.

FIG. 11 is a block diagram of a system for performing the burning-in process for multiple modules. A system 200B configured in accordance with the third exemplary embodiment has an arrangement in which a cassette or board 500 on which multiple modules 300 are mounted is attached to the suction stage 250. An interconnection pattern used to connect the external terminals of the modules 300 is formed on the board 500. The stress current drive part 220A and the measurement current drive part 220B are connected to the interconnection pattern on the board 500 via control lines rather than the probe pins. In this manner, the stress current and the measurement current are applied to the selected module 300.

In the burn-in process for the module on which the VCSEL is mounded, the light emission post should not be covered with an organic material having carbonization/discoloration/combustibility because the temperature of the light emitting portion rises greatly.

A description will now be given of a fourth exemplary embodiment, which is different from the first through third exemplary embodiments in the following. The first through third exemplary embodiments apply the stress current to the VCSEL or VCSELs and then apply the measurement current thereto for the electro-optic characteristic in which the amount of light responsive to the measurement current is measured. In contrast, the fourth exemplary embodiment is configured to screen VCSELs by measuring an electric characteristic rather than the electro-optic characteristic. The VCSELs have a tendency such that the operation voltage of the normal VCSEL drops with high or great stress current being applied thereto. The fourth exemplary embodiment utilizes the above tendency.

In the system illustrated in FIGS. 5 through 8, the selected one of the VCSELs on the suction stage 250 is supplied with great stress current for obtaining a predetermined light output via the p-side and n-side probe pins. The stress current may be greater than the thermal rollover R, and is preferably within the range B illustrated in FIG. 4. The operating voltage of the VCSEL is measured while the stress current is applied thereto. Then, the operating voltage is compared with a predetermined threshold value. If the measured operating voltage is less than the threshold value, the VCSEL is determined to be normal. If not, it is determined that the VCSEL is faulty.

The fourth exemplary embodiment does not employ the amount-of-light measurement unit, and is greatly less expensive. The fourth exemplary embodiment may be combined with any of the first through third exemplary embodiments. The period of time during which current is applied may be extended up to the MTTF with which the breakdown test is performed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A burn-in method comprising:
   applying a stress current for applying thermal stress to a surface-emitting semiconductor laser, the stress current being applied for about 2 seconds and causing the surface-emitting semiconductor laser temperature to be around 600° C.;
   measuring an operation characteristic of the surface-emitting semiconductor laser to which the stress current is applied, the operation characteristic being one of an electro-optic characteristic and an electric characteristic of the surface-emitting semiconductor laser; and
   making a pass/fail decision on the surface-emitting semiconductor laser on the basis of the operation characteristic measured,
   wherein the stress current is greater than a drive current which causes a thermal rollover and is less than another current that causes the surface-emitting semiconductor laser to fail due to overcurrent.

2. The burn-in method according to claim 1, wherein the surface-emitting semiconductor laser is placed at an environment temperature that is about a room temperature of 25° C.

3. The burn-in method according to claim 1, further comprising:
   attaching a wafer on which multiple surface emitting semiconductor lasers are formed to a support member at an environment temperature that is about a room temperature of 25° C.; and
   applying the stress current to the multiple surface emitting semiconductor lasers and measuring operation characteristics of the multiple surface emitting semiconductor lasers.

4. The burn-in method according to claim 3, wherein each of the multiple surface emitting semiconductor lasers is subjected to the applying the stress current to the multiple surface emitting semiconductor lasers and is successively subjected to the measuring operation characteristics of the multiple surface emitting semiconductor lasers.

5. The burn-in method according to claim 1, further comprising:

attaching multiple surface emitting semiconductor laser devices to a support member at an environment temperature that is about a room temperature of 25° C., each of the multiple surface emitting semiconductor laser devices including a single surface emitting semiconductor laser; and applying the stress current to the multiple surface emitting semiconductor laser devices and measuring operation characteristics of the multiple surface emitting semiconductor laser devices.

6. The burn-in method according to claim 1, wherein the measuring the operation characteristic includes measuring an optical output characteristic of the surface emitting semiconductor laser while applying a measurement current to the surface emitting semiconductor laser.

7. The burn-in method according to claim 1, wherein:

the measuring the operation characteristic includes measuring an operating voltage obtained while the stress current is applied to the surface emitting semiconductor laser; and the making the pass/fail decision judging that the surface emitting semiconductor laser is normal when the operating voltage is lower than a threshold value and judging that the surface emitting semiconductor laser is faulty when the operating voltage is equal to or higher than the threshold value.

8. The burn-in method according to claim 1, wherein the operation characteristic is one of optical power and operation voltage of the surface-emitting semiconductor laser.

* * * * *